(12) United States Patent
Wang et al.

(10) Patent No.: US 10,680,519 B2
(45) Date of Patent: Jun. 9, 2020

(54) VOLTAGE CONVERSION CIRCUIT WITH A BLEED CIRCUIT

(71) Applicant: Huawei Technologies Co., Ltd., Shenzhen, Guangdong (CN)

(72) Inventors: Jiake Wang, Shenzhen (CN); Liang Chen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/183,233

(22) Filed: Nov. 7, 2018

(65) Prior Publication Data

US 2019/0074767 A1    Mar. 7, 2019

Related U.S. Application Data

(63) Continuation of application No. 15/785,206, filed on Oct. 16, 2017, now Pat. No. 10,148,182, which is a
(Continued)

(30) Foreign Application Priority Data

Apr. 17, 2015    (CN) .......................... 2015 1 0187425

(51) Int. Cl.
*H02M 3/158* (2006.01)
*H02M 1/32* (2007.01)
*H03K 17/687* (2006.01)

(52) U.S. Cl.
CPC ............. *H02M 3/158* (2013.01); *H02M 1/32* (2013.01); *H02M 3/1588* (2013.01); *H03K 17/6872* (2013.01); *Y02B 70/1466* (2013.01)

(58) Field of Classification Search
CPC ....... H02M 3/156–158; H02M 3/1588; H02M 1/32; H02M 1/36; H03K 17/6872; G05F 1/10; G05F 1/40
(Continued)

(56) References Cited

U.S. PATENT DOCUMENTS 6,377,112 B1 * 4/2002 Rozsypal ............ H01L 27/0921
327/534
8,174,209 B2 * 5/2012 Bayer .................. H02M 3/1582
315/294
(Continued)

FOREIGN PATENT DOCUMENTS

CN          101420177 A      4/2009
CN          101860209 A     10/2010
(Continued)

*Primary Examiner* — Yemane Mehari
(74) *Attorney, Agent, or Firm* — Leydig, Voit & Mayer, Ltd.

(57) ABSTRACT

The present disclosure discloses a voltage conversion circuit, including: a first power transistor; a second power transistor, where the second power transistor is cut off when the first power transistor is conductive and is conductive when the first power transistor is cut off; a first energy storage element; a second energy storage element, a bleed module, configured to be coupled to the first power transistor, where when the first power transistor is cut off and a voltage of a source of the first power transistor reaches a source threshold, provide a current path for a current flowing from the source of the first power transistor to the ground. By means of the foregoing, a voltage difference between a drain and the source of the first power transistor can be decreased, thereby reducing a risk of burning out the first power transistor, and avoiding an increase in manufacturing costs.

15 Claims, 5 Drawing Sheets

Related U.S. Application Data continuation of application No. PCT/CN2015/095064, filed on Nov. 19, 2015.

(58) Field of Classification Search
USPC .............. 323/225, 284, 285, 312, 315, 316
See application file for complete search history.

(56) References Cited

U.S. PATENT DOCUMENTS

| | | | |
|---|---|---|---|
| 8,294,436 B2* | 10/2012 | Serdarevic | H02M 3/158 323/225 |
| 8,823,339 B2 | 9/2014 | Lee et al. | |
| 2003/0090313 A1* | 5/2003 | Burgener | H01P 1/15 327/408 |
| 2010/0013451 A1* | 1/2010 | Nakamura | H02M 3/1588 323/282 |
| 2010/0194366 A1* | 8/2010 | Serdarevic | H02M 3/158 323/283 |
| 2010/0225290 A1 | 9/2010 | Nalbant | |
| 2010/0314945 A1 | 12/2010 | Yamazaki et al. | |
| 2012/0262138 A1* | 10/2012 | Srinivasan | G05F 1/575 323/279 |
| 2014/0126260 A1* | 5/2014 | Amrutur | H02M 7/217 363/127 |
| 2014/0300413 A1* | 10/2014 | Hoyerby | H02M 1/08 330/251 |
| 2014/0312862 A1 | 10/2014 | Xie et al. | |
| 2015/0123480 A1* | 5/2015 | Xu | H02J 7/0068 307/66 |

FOREIGN PATENT DOCUMENTS

| | | |
|---|---|---|
| CN | 103187870 A | 7/2013 |
| CN | 103227566 A | 7/2013 |
| CN | 103248222 A | 8/2013 |
| CN | 103532521 A | 1/2014 |
| CN | 104779782 A | 7/2015 |
| EP | 2216877 A1 | 8/2010 |
| EP | 2624426 A1 | 8/2013 |
| JP | 2006333595 A | 12/2006 |

* cited by examiner

VOLTAGE CONVERSION CIRCUIT WITH A BLEED CIRCUIT

CROSS-REFERENCE TO RELATED APPLICATIONS

This application is a continuation of U.S. patent application Ser. No. 15/785,206, filed on Oct. 16, 2017, which is a continuation of International Application No. PCT/CN2015/095064, filed on Nov. 19, 2015, which claims priority to Chinese Patent Application No. 201510187425.2, filed on Apr. 17, 2015. All of the afore-mentioned patent applications are hereby incorporated by reference in their entireties.

TECHNICAL FIELD

The present disclosure relates to the field of power management technologies, and in particular, to a voltage conversion circuit.

BACKGROUND

With rapid development of consumer electronics, as an important part of electronics, a power management integrated circuit (PMIC) has advantages such as high integration, high conversion efficiency, and low costs. In recent years, electronics such as smartphones and tablet computers are upgraded rapidly, and a requirement on the power management integrated circuit is increasingly higher.

As shown in FIG. 1, an existing power management integrated circuit includes a gate controller 11, a PMOS power transistor 12, and an NMOS power transistor 13. A gate of the PMOS power transistor 12 and a gate of the NMOS power transistor 13 are both connected to the gate controller 11; a source of the PMOS power transistor 12 is connected to a first reference voltage V1; a drain of the PMOS power transistor 12 is connected to a drain of the NMOS power transistor 13; a source of the NMOS power transistor 13 is grounded; a parasitic inductor L1 is formed between the source of the PMOS power transistor 12 and the first reference voltage, and a parasitic inductor L2 is formed between the source of the NMOS power transistor 13 and the ground.

When the PMOS power transistor 12 is switched off, a current flowing through the PMOS power transistor 12 abruptly changes to 0, while a current of the parasitic inductor L1 cannot change abruptly, and continues flowing through a drain-source capacitor of the PMOS power transistor 12. A high voltage is generated at the source of the PMOS power transistor 12, and the drain of PMOS power transistor 12 is under the high voltage, which directly burns out an internal component of the power management integrated circuit.

To avoid the foregoing situation, in the prior art, some particular MASKs (dopants) are added in a process of manufacturing a chip, to improve withstand voltages of the PMOS power transistor 12 and the NMOS power transistor 13. Because dopants need to be added, manufacturing costs are increased.

SUMMARY

Embodiments of the present disclosure provide a voltage conversion circuit, so as to avoid an increase in manufacturing costs.

A first aspect provides a voltage conversion circuit, where the voltage conversion circuit is configured to convert a first voltage into a second voltage, and includes:
a first power transistor;
a second power transistor, where the second power transistor is cut off when the first power transistor is conductive and is conductive when the first power transistor is cut off;
a first energy storage element;
a second energy storage element, configured to be coupled to the first power transistor and the second power transistor, where when the first power transistor is conductive and the second power transistor is cut off, a power supply providing the first voltage charges the second energy storage element though the first energy storage element; when the first power transistor is cut off and the second power transistor is conductive, the second energy storage element discharges through the first energy storage element by using the second power transistor; a connection end for connecting and the first energy storage element and the second energy storage element outputs the second voltage; and the second voltage depends on the first voltage, an ON time of the first power transistor, and an ON time of the second power transistor; and a bleed module, configured to be coupled to the first power transistor, where when the first power transistor is cut off and a voltage of a source of the first power transistor reaches a source threshold, provide a current path for a current flowing from the source of the first power transistor to the ground.

With reference to the first aspect, in a first implementation manner, the bleed module includes a bleed transistor, configured to be coupled to the first power transistor, and conduct when the first power transistor is cut off and the voltage of the source of the first power transistor reaches the source threshold.

With reference to the first implementation manner of the first aspect, in a second implementation manner, a value of the source threshold is a sum of the first voltage and an ON threshold of the bleed transistor.

With reference to any one of the first aspect to the second implementation manner, in a third implementation manner, the circuit further includes a gate controller and a resistor, the source of the first power transistor is connected to the power supply, a gate of the first power transistor and a gate of the second power transistor are connected to the gate controller, a drain of the first power transistor is connected to a drain of the second power transistor, a source of the second power transistor is grounded, one end of the first energy storage element is connected to the drain of the first power transistor, the other end of the first energy storage element is connected to one end of the second energy storage element, the other end of the second energy storage element is grounded, and the resistor is connected in parallel to the second energy storage element.

With reference to any one of the first implementation manner to the third implementation manner of the first aspect, in a fourth implementation manner, a gate of the bleed transistor is connected to the power supply, a source of the bleed transistor is connected to the source of the first power transistor, a drain of the bleed transistor is connected to the drain of the first power transistor, and when the bleed transistor is conductive, the current flowing from the source of the first power transistor to the ground flows through the bleed transistor and the second power transistor.

With reference to any one of the first implementation manner to the third implementation manner of the first aspect, in a fifth implementation manner, a gate of the bleed transistor is connected to the power supply, a source of the bleed transistor is connected to the source of the first power transistor, a drain of the bleed transistor is connected to the drain of the second power transistor, and when the bleed transistor is conductive, the current flowing from the source of the first power transistor to the ground flows through the bleed transistor.

A second aspect provides a voltage conversion circuit, where the voltage conversion circuit is configured to convert a first voltage into a second voltage, and includes:
a first power transistor;
a second power transistor, where the second power transistor is cut off when the first power transistor is conductive and is conductive when the first power transistor is cut off;
a first energy storage element;
a second energy storage element, configured to be coupled to the first power transistor and the second power transistor, where when the first power transistor is conductive and the second power transistor is cut off, the first voltage is used to charge the first energy storage element; when the first power transistor is cut off and the second power transistor is conductive, a power supply providing the first voltage and the first energy storage element charge the second energy storage element; a connection end for connecting and the second power transistor and the second energy storage element outputs the second voltage; and the second voltage depends on the first voltage, an ON time of the first power transistor, and an ON time of the second power transistor; and a bleed module, configured to be coupled to the first power transistor, wherein the first power transistor is cut off and a voltage of a drain of the first power transistor reaches a source threshold, provide a current path for a current flowing from the drain of the first power transistor to the ground.

With reference to the second aspect, in a first implementation manner, the bleed module includes a bleed transistor, configured to be coupled to the first power transistor, and conduct when the first power transistor is cut off and the voltage of the drain of the first power transistor reaches the source threshold.

With reference to the first implementation manner of the second aspect, in a second implementation manner, a value of the source threshold is a sum of the first voltage and an ON threshold of the bleed transistor.

With reference to any one of the second aspect to the second implementation manner, in a third implementation manner, the circuit further includes a gate controller and a resistor, the drain of the first power transistor is connected to the power supply by using the first energy storage element, a gate of the first power transistor and a gate of the second power transistor are connected to the gate controller, a source of the first power transistor is grounded, a drain of the second power transistor is connected to the drain of the first power transistor, a source of the second power transistor is connected to one end of the second energy storage element, the other end of the second energy storage element is grounded, and the resistor is connected in parallel to the second energy storage element.

With reference to any one of the first implementation manner to the third implementation manner of the second aspect, in a fourth implementation manner, a gate of the bleed transistor is connected between the resistor and the second power transistor, a source of the bleed transistor is connected to the drain of the first power transistor, a drain of the bleed transistor is connected to the source of the first power transistor, and the current flowing from the drain of the first power transistor to the ground flows through the bleed transistor.

A third aspect provides a voltage conversion circuit, where the voltage conversion circuit is configured to convert a first voltage into a second voltage, and includes:
a first power transistor;
a second power transistor, where the second power transistor is cut off when the first power transistor is conductive and is conductive when the first power transistor is cut off;
a third power transistor;
a fourth power transistor, where the fourth power transistor is cut off when the third power transistor is conductive and is conductive when the third power transistor is cut off;
a first energy storage element, configured to be coupled to the first power transistor and the second power transistor; a second energy storage element, configured to be coupled to the third power transistor and the fourth power transistor, where when the fourth power transistor is conductive and the third power transistor is cut off, and when the first power transistor is conductive and the second power transistor is cut off, a power supply providing the first voltage charges the second energy storage element through the first energy storage element; when the first power transistor is cut off, and the second power transistor is conductive, the second energy storage element discharges through the first energy storage element by using the second power transistor; a connection end for connecting and the fourth power transistor and the second energy storage element outputs the second voltage; and the second voltage depends on the first voltage, an ON time of the first power transistor, and an ON time of the second power transistor; and when the first power transistor is conductive and the second power transistor is cut off, and when the third power transistor is conductive and the fourth power transistor is cut off, the first voltage is used to charge the first energy storage element; when the fourth power transistor is conductive and the third power transistor is cut off, the power supply providing the first voltage and the first energy storage element charge the second energy storage element; the connection end between the fourth power transistor and the second energy storage element outputs the second voltage; and the second voltage depends on the first voltage, an ON time of the third power transistor, and an ON time of the fourth power transistor;
a first bleed module, configured to be coupled to the first power transistor, where when the first power transistor is cut off and a voltage of a source of the first power transistor reaches a first source threshold, provide a current path for a current flowing from the source of the first power transistor to the ground; and a second bleed module, configured to be coupled to the third power transistor, and when the third power transistor is cut off and a voltage of a drain of the third power transistor reaches a second source threshold, provide a current path for a current flowing from the drain of the third power transistor to the ground.

With reference to the third aspect, in a first implementation manner, the circuit further includes a gate controller and a resistor, the source of the first power transistor is connected to the power supply, a gate of the first power transistor, a gate of the second power transistor, a gate of the third power transistor, and a gate of the fourth power transistor are all connected to the gate controller, a drain of the first power transistor is connected to a drain of the second power transistor, a source of the second power transistor is grounded, one end of the first energy storage element is connected to the drain of the first power transistor, the other end of the first energy storage element is connected to the drain of the third power transistor, a source of the third power transistor is grounded, a drain of the fourth power transistor is connected to the drain of the third power transistor, a source of the fourth power transistor is connected to one end of the second energy storage element, the other end of the second energy storage element is grounded, and the resistor is connected in parallel to the second energy storage element.

With reference to the first implementation manner of the third aspect, in a second implementation manner, the first bleed module includes a first bleed transistor, configured to be coupled to the first power transistor, and conduct when the first power transistor is cut off and the voltage of the source of the first power transistor reaches the first source threshold.

With reference to the second implementation manner of the third aspect, in a third implementation manner, a value of the first source threshold is a sum of the first voltage and an ON threshold of the first bleed transistor.

With reference to the second implementation manner or the third implementation manner of the third aspect, in a fourth implementation manner, a source of the first bleed transistor is connected to the source of the first power transistor, a gate of the first bleed transistor is connected to the power supply, a drain of the first bleed transistor is connected to the drain of the first power transistor, and when the first bleed transistor is conductive, the current flowing from the source of the first power transistor to the ground flows through the first bleed transistor and the second power transistor.

With reference to the second implementation manner or the third implementation manner of the third aspect, in a fifth implementation manner, a source of the first bleed transistor is connected to the source of the first power transistor, a gate of the first bleed transistor is connected to the power supply, a drain of the first bleed transistor is connected to the drain of the second power transistor, and when the first bleed transistor is conductive, the current flowing from the source of the first power transistor to the ground flows through the first bleed transistor.

With reference to the first implementation manner of the third aspect, in a sixth implementation manner, the second bleed module includes a second bleed transistor, configured to be coupled to the third power transistor, and conduct when the third power transistor is cut off and the voltage of the drain of the third power transistor reaches the second source threshold.

With reference to the sixth implementation manner of the third aspect, in a seventh implementation manner, a value of the second source threshold is a sum of the first voltage and an ON threshold of the second bleed transistor.

With reference to the sixth implementation manner or the seventh implementation manner of the third aspect, in an eighth implementation manner, a gate of the second bleed transistor is connected between the resistor and the fourth power transistor, a source of the second bleed transistor is connected to the drain of the third power transistor, a drain of the second bleed transistor is connected to a source of the third power transistor, and the current flowing from the drain of the third power transistor to the ground flows through the second bleed transistor.

According to the foregoing solutions, the present disclosure has the following beneficial effect: in the present disclosure, a bleed module is coupled to a first power transistor, and when the first power transistor is cut off and a voltage of a source of the first power transistor reaches a source threshold, a current path is provided for a current flowing from the source of the first power transistor to the ground, thereby decreasing a voltage difference between a drain and the source of the first power transistor, reducing a risk of burning out the first power transistor, and avoiding an increase in manufacturing costs.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 1:
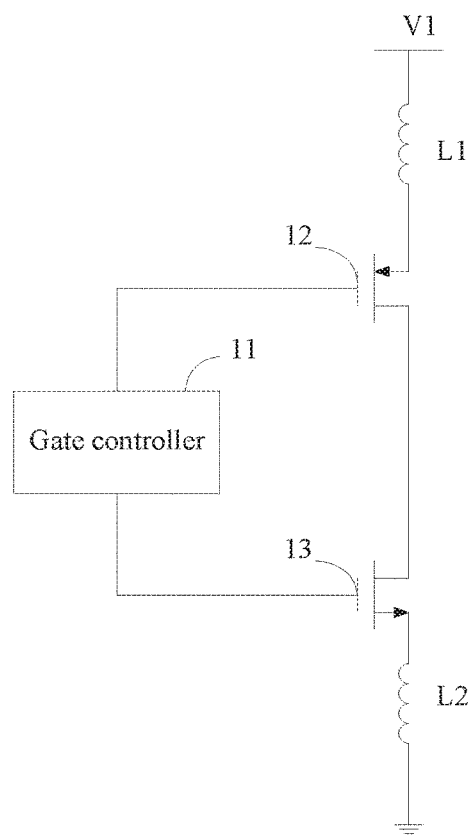
FIG. 1 is a circuit diagram of an existing power management integrated circuit.
Figure 2:
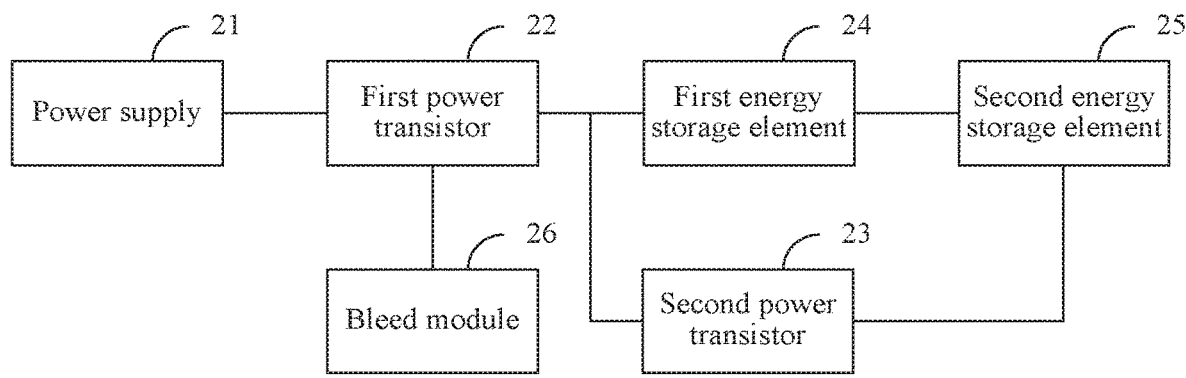
FIG. 2 is a structural diagram of a voltage conversion circuit according to a first embodiment of the present disclosure.

Referring to FIG. 2, FIG. 2 is a structural diagram of a voltage conversion circuit according to a first embodiment of the present disclosure. As shown in FIG. 2, the voltage conversion circuit 20 disclosed in this embodiment includes: a power supply 21, a first power transistor 22, a second power transistor 23, a first energy storage element 24, a second energy storage element 25, and a bleed module 26, where the voltage conversion circuit 20 is configured to convert a first voltage V1 into a second voltage V2.

The power supply 21 is coupled to the first power transistor 22, the second power transistor 23 and the first energy storage element 24 are both coupled to the first power transistor 22, the second energy storage element 25 is coupled to the first energy storage element 24, and the bleed module 26 is coupled to the first power transistor 22. The second power transistor 23 is cut off when the first power transistor 22 is conductive and is conductive when the first power transistor 22 is cut off.

The second energy storage element 25 is configured to be coupled to the first power transistor 22 and the second power transistor 23, and when the first power transistor 22 is conductive and the second power transistor 23 is cut off, the power supply 21 providing the first voltage V1 charges the second energy storage element 25 through the first energy storage element 24, where a current that is provided by the power supply 21 to charge the second energy storage element 25 flows through the first power transistor 22 and the first energy storage element 24, so that a voltage of the second energy storage element 25 can rise to V1. When the first power transistor 22 is cut off and the second power transistor 23 is conductive, the second energy storage element 25 discharges through the first energy storage element 24 by using the second power transistor 23. A discharge current of the second energy storage element 25 flows through the first energy storage element 24 and the second power transistor 23, so that a voltage value of the second energy storage element 25 decreases. A connection end for connecting and the first energy storage element 24 and the second energy storage element 25 outputs the second voltage V2, and the second voltage V2 depends on the first voltage V1, an ON time of the first power transistor 22, and an ON time of the second power transistor 23, where the second voltage V2 is less than the first voltage V1.

When the first power transistor 22 is cut off and a voltage of a source of the first power transistor 22 reaches a source threshold, the bleed module 26 provides a current path for a current flowing from the source of the first power transistor 22 to the ground, to decrease a voltage difference between the source and a drain of the first power transistor 22, thereby reducing a risk of burning out the first power transistor 22.

Preferably, the first power transistor 22 is a P-type MOS transistor, the second power transistor 23 is an N-type MOS transistor, the first energy storage element 24 is an inductor, and the second energy storage element 25 is a capacitor.

The bleed module 26 disclosed in this embodiment is coupled to the first power transistor 22. When the first power transistor 22 is cut off and a voltage of a source of the first power transistor 22 reaches a source threshold, the bleed module 26 provides a current path for a current flowing from the source of the first power transistor 22 to the ground, to decrease a voltage difference between the source and a drain of the first power transistor 22, thereby reducing a risk of burning out the first power transistor 22.

Figure 3:
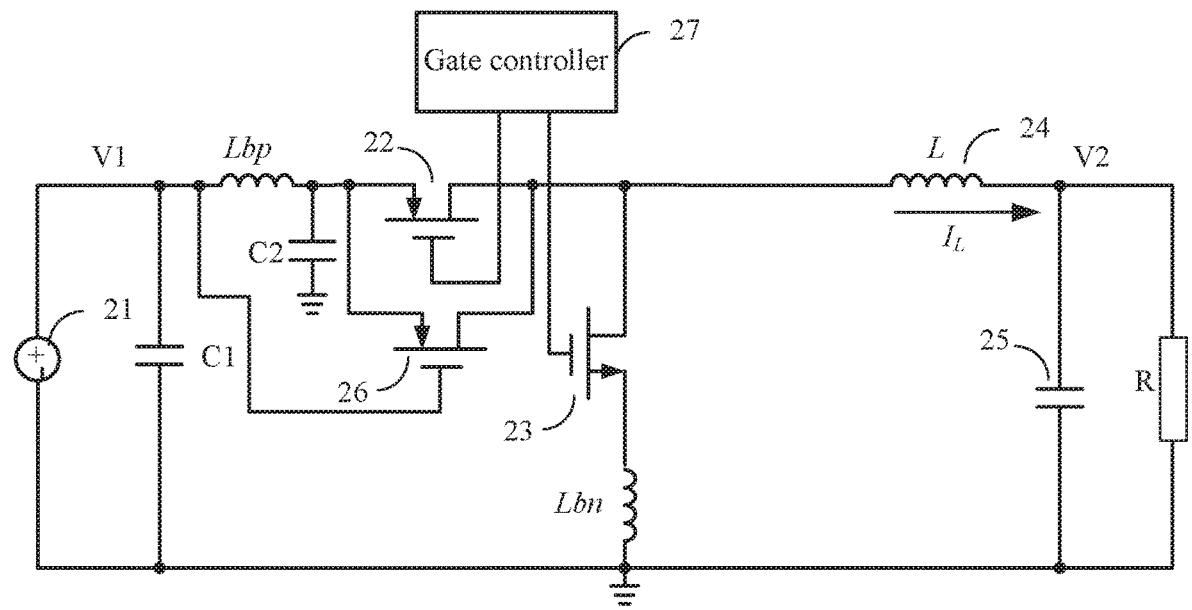
FIG. 3 is a circuit diagram of a voltage conversion circuit according to a second embodiment of the present disclosure.

The present disclosure further provides a voltage conversion circuit of a second embodiment, which is described based on the voltage conversion circuit 20 disclosed in the first embodiment. As shown in FIG. 3, the circuit disclosed in this embodiment further includes: a first capacitor C1, a resistor R, and a gate controller 27. The first capacitor C1 is connected in parallel to a power supply 21, a source of a first power transistor 22 is connected to the power supply 21, and a gate of the first power transistor 22 and a gate of a second power transistor 23 are connected to the gate controller 27. The gate controller 27 is configured to control the first power transistor 22 and the second power transistor 23 to be conductive or to be cut off. A drain of the first power transistor 22 is connected to a drain of the second power transistor 23, a source of the second power transistor 23 is grounded, one end of a first energy storage element 24 is connected to the drain of the first power transistor 22, the other end of the first energy storage element 24 is connected to one end of a second energy storage element 25, the other end of the second energy storage element 25 is grounded, and the resistor R is connected in parallel to the second energy storage element 25. A bleed module 26 includes a bleed transistor. A gate of the bleed transistor is connected to the power supply 21, a source of the bleed transistor is connected to the source of the first power transistor 22, and a drain of the bleed transistor is connected to the drain of the first power transistor 22. When the bleed transistor is conductive, a current flowing from the source of the first power transistor 22 to the ground flows through the bleed transistor and the second power transistor 23.

When the gate controller 27 controls the first power transistor 22 to be conductive and the second power transistor 23 to be cut off, the power supply 21 provides a first voltage V1 for the first energy storage element 24 and the second energy storage element 25, that is, the power supply 21 charges the second energy storage element 25 through the first energy storage element 24, and a current that is provided by the power supply 21 to charge the second energy storage element 25 flows through the first power transistor 22 and the first energy storage element 24. When the gate controller 27 controls the first power transistor 22 to be cut off and the second power transistor 23 to be conductive, the second energy storage element 25, the first energy storage element 24, and the second power transistor 23 form a loop, and the second energy storage element 25 discharges through the first energy storage element 24 by using the second power transistor 23. A discharge current of the second energy storage element 25 flows through the first energy storage element 24 and the second power transistor 23. A connection end for connecting and the first energy storage element 24 and the second energy storage element 25 outputs a second voltage V2, and the second voltage V2 depends on the first voltage V1, an ON time of the first power transistor 22, and an ON time of the second power transistor 23.

A first parasitic inductor Lbp is formed between the source of the first power transistor 22 and the power supply 21, a parasitic capacitor C2 is formed between the source of the first power transistor 22 and the ground, and a second parasitic inductor Lbn is formed between the source of the second power transistor 23 and the ground. When the first power transistor 22 is cut off, because a current flowing through the first parasitic inductor Lbp cannot change abruptly, the current flowing through the first parasitic inductor Lbp continues charging the parasitic capacitor C2, causing a voltage of the source of the first power transistor 22 to be charged to a high level. When the voltage of the source of the first power transistor 22 reaches a source threshold, the bleed transistor is conductive, to provide a current path for the current flowing from the source of the first power transistor 22 to the ground, that is, the current flowing from the source of the first power transistor 22 to the ground flows through the bleed transistor and the second power transistor 23, to decrease the voltage of the source of the first power transistor 22. When the voltage of the source of the first power transistor 22 is less than the source threshold, the bleed transistor is cut off. A value of the source threshold is preferably a sum of the first voltage V1 and an ON threshold of the bleed transistor, and the bleed transistor is preferably a P-type MOS transistor.

A voltage difference Vdspmos between the source S and the drain D of the first power transistor 22 is:

$$Vdspmos=V1+Vth+Vd \quad (1)$$

As can be known according to the formula (1), the voltage difference Vdspmos between the source and the drain of the first power transistor 22 is clamped. Even if the first power transistor 22 is shut down rapidly, reliability of the first power transistor 22 can be ensured.

Figure 4:
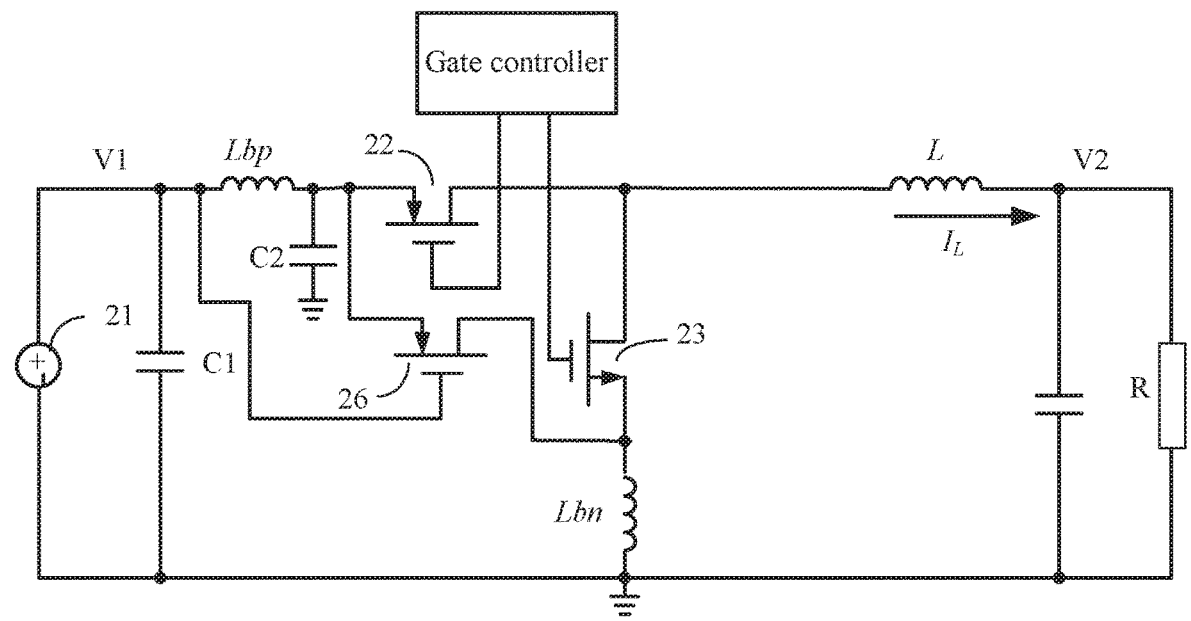
FIG. 4 is a circuit diagram of a voltage conversion circuit according to a third embodiment of the present disclosure.

The present disclosure further provides a voltage conversion circuit of a third embodiment, which differs from the voltage conversion circuit disclosed in the second embodiment in that: as shown in FIG. 4, a gate of a bleed transistor disclosed in this embodiment is connected to a power supply 21, a source of the bleed transistor is connected to a source of a first power transistor 22, a drain of the bleed transistor is connected to a drain of a second power transistor 23, and when the bleed transistor is conductive, a current flowing from the source of the first power transistor 22 to the ground flows through the bleed transistor.

Figure 5:
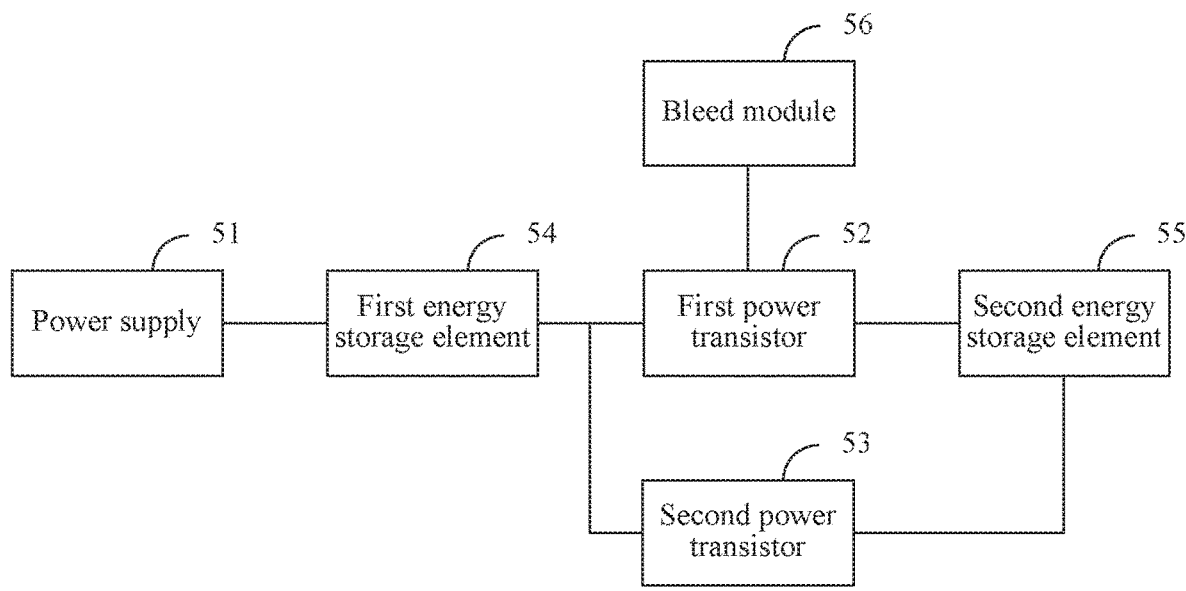
FIG. 5 is a structural diagram of a voltage conversion circuit according to a fourth embodiment of the present disclosure.

The present disclosure further provides a voltage conversion circuit of a fourth embodiment. As shown in FIG. 5, a voltage conversion circuit 50 disclosed in this embodiment includes: a power supply 51, a first power transistor 52, a second power transistor 53, a first energy storage element 54, a second energy storage element 55, and a bleed module 56, where the voltage conversion circuit 50 is configured to convert a first voltage V1 into a second voltage V2.

The power supply 51 is coupled to the first energy storage element 54, the second power transistor 53 and the first energy storage element 54 are both coupled to the first power transistor 52, the second energy storage element 25 is coupled to the first power transistor 52 and the second power transistor 53, and the bleed module 56 is coupled to the first power transistor 52. The second power transistor 53 is cut off when the first power transistor 52 is conductive and is conductive when the first power transistor 52 is cut off.

When the first power transistor 52 is conductive and the second power transistor 53 is cut off, the first voltage V1 charges the first energy storage element 54, and a current that is provided by the power supply 51 to charge the first energy storage element 54 flows through the first energy storage element 54 and the first power transistor 52, so that a voltage of the first energy storage element 54 can rise to V1. When the first power transistor 52 is cut off and the second power transistor 53 is conductive, the power supply 51 providing the first voltage V1 and the first energy storage element 54 charge the second energy storage element 55, and a charge current of the second energy storage element 55 flows through the first energy storage element 54 and the second power transistor 53. A connection end for connecting and the second power transistor 53 and the second energy storage element 55 outputs the second voltage V2, and the second voltage V2 depends on the first voltage V1, an ON time of the first power transistor 52, and an ON time of the second power transistor 53, where the second voltage V2 is greater than the first voltage V1.

When the first power transistor 52 is cut off and a voltage of a drain of the first power transistor 52 reaches a source threshold, the bleed module 56 provides a current path for a current flowing from the drain of the first power transistor 52 to the ground, to decrease a voltage difference between a source and the drain of the first power transistor 52, thereby reducing a risk of burning out the first power transistor 52.

Preferably, the first power transistor 52 is an N-type MOS transistor, the second power transistor 53 is a P-type MOS transistor, the first energy storage element 54 is an inductor, and the second energy storage element 55 is a capacitor.

The bleed module 56 disclosed in this embodiment is coupled to the first power transistor 52. When the first power transistor 52 is cut off and a voltage of a drain of the first power transistor 52 reaches a source threshold, the bleed module 56 provides a current path for a current flowing from the drain of the first power transistor 52 to the ground, to decrease a voltage difference between a source and the drain of the first power transistor 52, thereby reducing a risk of burning out the first power transistor 52.

Figure 6:
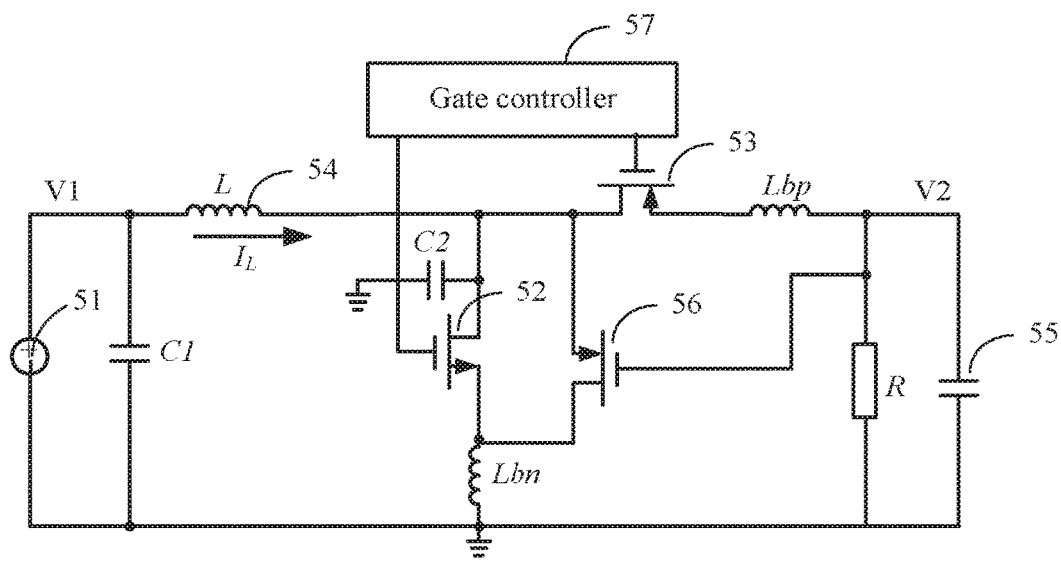
FIG. 6 is a circuit diagram of a voltage conversion circuit according to a fifth embodiment of the present disclosure.

The present disclosure further provides a voltage conversion circuit of a fifth embodiment, which is described based on the voltage conversion circuit 50 disclosed in the fourth embodiment. As shown in FIG. 6, the circuit disclosed in this embodiment further includes: a first capacitor C1, a resistor R, and a gate controller 57. The first capacitor C1 is connected in parallel to a power supply 51, a drain of a first power transistor 52 is connected to the power supply 51 by using a first energy storage element 54, and a gate of the first power transistor 52 and a gate of a second power transistor 53 are connected to the gate controller 57. The gate controller 57 is configured to control the first power transistor 52 and the second power transistor 53 to be conductive or to be cut off. A source of the first power transistor 52 is grounded, a drain of the second power transistor 53 is connected to the drain of the first power transistor 52, one end of a second energy storage element 55 is connected to a source of the second power transistor 53, the other end of the second energy storage element 55 is grounded, and the resistor R is connected in parallel to the second energy storage element 55. A bleed module 56 includes a bleed transistor. A gate of the bleed transistor is connected between the resistor R and the second power transistor 53, a source of the bleed transistor is connected to the drain of the first power transistor 52, and a drain of the bleed transistor is connected to the source of the first power transistor 52. When the bleed transistor is conductive, a current flowing from the drain of the first power transistor 52 to the ground flows through the second power transistor 53.

When the gate controller 57 controls the first power transistor 52 to be conductive and the second power transistor 53 to be cut off, the power supply 51 provides a first voltage V1 for the first energy storage element 54, that is, the power supply 51 charges the first energy storage element 54, and a current that is provided by the power supply 51 to charge the first energy storage element 54 flows through the first energy storage element 54 and the first power transistor 52. When the gate controller 57 controls the first power transistor 52 to be cut off and the second power transistor 53 to be conductive, the power supply 51 providing the first voltage V1 and the first energy storage element 54 charge the second energy storage element 55, and a charge current flows through the first energy storage element 54, the second power transistor 53, and the second energy storage element 55. A connection end for connecting and the second power transistor 53 and the second energy storage element 55 outputs a second voltage V2, and the second voltage V2 depends on the first voltage V1, an ON time of the first power transistor 52, and an ON time of the second power transistor 53.

A first parasitic inductor Lbn is formed between the source of the first power transistor 52 and the ground, a parasitic capacitor C2 is formed between the drain of the first power transistor 52 and the ground, and a second parasitic inductor Lbp is formed between the source of the second power transistor 53 and the second energy storage element 55. When the first power transistor 52 is cut off, because a current flowing through the first parasitic inductor Lbn cannot change abruptly, the current flowing through the first parasitic inductor Lbn continues charging the parasitic capacitor C2, causing a voltage of the drain of the first power transistor 52 to be charged to a high level. When the voltage of the drain of the first power transistor 52 reaches a source threshold, the bleed transistor is conductive, to provide a current path for the current flowing from the drain of the first power transistor 52 to the ground, that is, the current flowing from the drain of the first power transistor 52 to the ground flows through the bleed transistor, to decrease the voltage of the drain of the first power transistor 52. When the voltage of the drain of the first power transistor 52 is less than the source threshold, the bleed transistor is cut off. A value of the source threshold is preferably a sum of the first voltage V1 and an ON threshold of the bleed transistor, and the bleed transistor is preferably a P-type MOS transistor.

Figure 7:
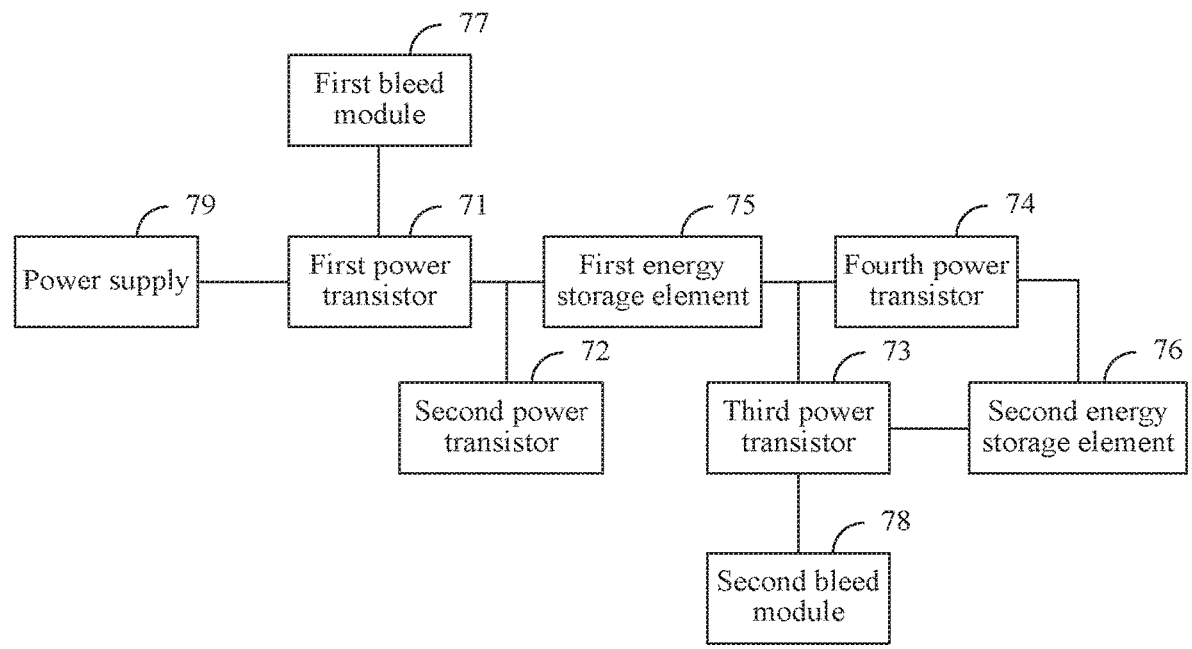
FIG. 7 is a structural diagram of a voltage conversion circuit according to a sixth embodiment of the present disclosure.

The present disclosure further provides a voltage conversion circuit of a sixth embodiment. As shown in FIG. 7, the voltage conversion circuit disclosed in this embodiment includes: a first power transistor 71, a second power transistor 72, a third power transistor 73, a fourth power transistor 74, a first energy storage element 75, a second energy storage element 76, a first bleed module 77, a second bleed module 78, and a power supply 79, where the voltage conversion circuit is configured to convert a first voltage V1 into a second voltage V2.

The first power transistor 71 is coupled to the power supply 79, the second power transistor 72 and the first energy storage element 75 are both coupled to the first power transistor 71, the third power transistor 73 and the fourth power transistor 74 are both coupled to the first energy storage element 75, the second energy storage element 76 is coupled to the third power transistor 73 and the fourth power transistor 74, the first bleed module 77 is coupled to the first power transistor 71, and the second bleed module 78 is coupled to the third power transistor 73. The second power transistor 72 is cut off when the first power transistor 71 is conductive and is conductive when the first power transistor 71 is cut off; and the fourth power transistor 74 is cut off when the third power transistor 73 is conductive and is conductive when the third power transistor 73 is cut off.

When the third power transistor 73 is cut off and the fourth power transistor 74 is conductive, a working principle of the voltage conversion circuit is the same as that of the voltage conversion circuit 20 disclosed in the first embodiment. When the first power transistor 71 is conductive and the second power transistor 72 is cut off, the power supply 79 providing the first voltage V1 charges the second energy storage element 76 through the first energy storage element 75, and a current that is provided by the power supply 79 to charge the second energy storage element 76 flows through the first power transistor 71, the first energy storage element 75, and the fourth power transistor 74, so that a voltage of the second energy storage element 76 can rise to V1. When the first power transistor 71 is cut off and the second power transistor 72 is conductive, the second energy storage element 76 discharges through the fourth power transistor 74 and the first energy storage element 75 by using the second power transistor 72, and a discharge current of the second energy storage element 76 flows through the fourth power transistor 74, the first energy storage element 71, and the second power transistor 72, so that a voltage value of the second energy storage element 76 decreases. A connection end for connecting and the fourth power transistor 74 and the second energy storage element 76 outputs the second voltage V2, and the second voltage V2 depends on the first voltage V1, an ON time of the first power transistor 71, and an ON time of the second power transistor 72, where the second voltage V2 is less than the first voltage V1.

When the first power transistor 71 is cut off and a voltage of a source of the first power transistor 71 reaches a source threshold, the first bleed module 77 provides a current path for a current flowing from the source of the first power transistor 71 to the ground, to decrease a voltage difference between the source and a drain of the first power transistor 71, thereby reducing a risk of burning out the first power transistor 71.

When the second power transistor 72 is cut off and the first power transistor 71 is conductive, a working principle of the voltage conversion circuit is the same as that of the voltage conversion circuit 50 disclosed in the fourth embodiment. When the third power transistor 73 is conductive and the fourth power transistor 74 is cut off, the first voltage V1 charges the first energy storage element 75, and a current that is provided by the power supply 79 to charge the first energy storage element 75 flows through the first power transistor 71, the first energy storage element 75, and the third power transistor 73, so that a voltage of the first energy storage element 75 can rise to V1. When the third power transistor 73 is cut off and the fourth power transistor 74 is conductive, the power supply 79 providing the first voltage V1 and the first energy storage element 75 charge the second energy storage element 76, and a charge current of the second energy storage element 76 flows through the first power transistor 71, the first energy storage element 75, and the fourth power transistor 74. The connection end between the fourth power transistor 74 and the second energy storage element 76 outputs the second voltage V2, and the second voltage V2 depends on the first voltage V1, an ON time of the third power transistor 73, and an ON time of the fourth power transistor 74, where the second voltage V2 is greater than the first voltage V1.

When the third power transistor 73 is cut off and a voltage of a drain of the third power transistor 73 reaches the source threshold, the second bleed module 78 provides a current path for a current flowing from the drain of the third power transistor 73 to the ground, to decrease a voltage difference between a source and the drain of the third power transistor 73, thereby reducing a risk of burning out the third power transistor 73.

Preferably, the first power transistor 71 is a P-type MOS transistor, the second power transistor 72 is an N-type MOS transistor, the third power transistor 73 is an N-type MOS transistor, the fourth power transistor 74 is a P-type MOS transistor, the first energy storage element 75 is an inductor, and the second energy storage element 76 is a capacitor.

Figure 8:
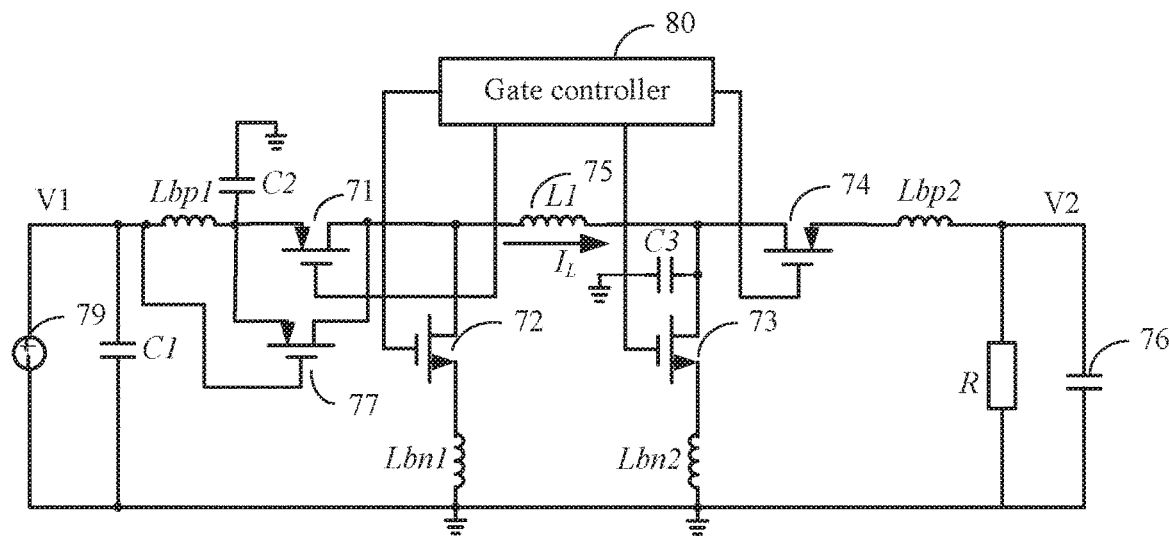
FIG. 8 is a circuit diagram of a voltage conversion circuit according to a seventh embodiment of the present disclosure.

The present disclosure further provides a voltage conversion circuit of an eighth embodiment, which is described based on the voltage conversion circuit disclosed in the seventh embodiment. As shown in FIG. 8, the circuit disclosed in this embodiment further includes: a first capacitor C1, a resistor R, and a gate controller 80. The first capacitor C1 is connected in parallel to a power supply 79, a source of a first power transistor 71 is connected to the power supply 79, a gate of the first power transistor 71, a gate of a second power transistor 72, a gate of a third power transistor 73, and a gate of a fourth power transistor 74 are all connected to the gate controller 80, a drain of the first power transistor 71 is connected to a drain of the second power transistor 72, a source of the second power transistor 72 is grounded, one end of a first energy storage element 75 is connected to the drain of the first power transistor 71, the other end of the first energy storage element 75 is connected to a drain of the third power transistor 73, a source of the third power transistor 73 is grounded, a drain of the fourth power transistor 74 is connected to the drain of the third power transistor 73, a source of the fourth power transistor 74 is connected to one end of a second energy storage element 76, the other end of the second energy storage element 76 is grounded, and the resistor R is connected in parallel to the second energy storage element 76.

When the gate controller 80 controls the third power transistor 73 to be cut off and the fourth power transistor 74 to be conductive, the gate controller 80 further controls the first power transistor 71 to be conductive and the second power transistor 72 to be cut off. The power supply 79 provides a first voltage V1 for the first energy storage element 75 and the second energy storage element 76, that is, the power supply 79 charges the second energy storage element 76 through the first energy storage element 75. A current that is provided by the power supply 79 to charge the second energy storage element 76 flows through the first power transistor 71, the first energy storage element 75, and the fourth power transistor 74. When the gate controller 80 controls the first power transistor 71 to be cut off and the second power transistor 72 to be conductive, the second energy storage element 76, the fourth power transistor 74, the first energy storage element 75, and the second power transistor 72 form a loop. The second energy storage element 76 discharges through the first energy storage element 75 by using the second power transistor 72, a discharge current of the second energy storage element 76 flows through the fourth power transistor 74, the first energy storage element 75, and the second power transistor 72. A first bleed module 77 includes a first bleed transistor. A gate of the first bleed transistor is connected to the power supply 79, a source of the first bleed transistor is connected to the source of the first power transistor 71, and a drain of the first bleed transistor is connected to the drain of the first power transistor 71. A second voltage V2 depends on the first voltage V1, an ON time of the first power transistor 71, and an ON time of the second power transistor 72.

A first parasitic inductor Lbp1 is formed between the source of the first power transistor 71 and the power supply 79, a parasitic capacitor C2 is formed between the source of the first power transistor 71 and the ground, a second parasitic inductor Lbn1 is formed between the source of the second power transistor 72 and the ground, a third parasitic inductor Lbn2 is formed between the source of the third power transistor 73 and the ground, a parasitic capacitor C3 is formed between the drain of the third power transistor 73 and the ground, and a fourth parasitic inductor Lbp2 is formed between the fourth power transistor 74 and the second energy storage element 76. When the first power transistor 71 is cut off, because a current flowing through the first parasitic inductor Lbp1 cannot change abruptly, the current flowing through the first parasitic inductor Lbp1 continues charging the parasitic capacitor C2, causing a voltage of the source of the first power transistor 71 to be charged to a high level. When the voltage of the source of the first power transistor 71 reaches a source threshold, the first bleed transistor is conductive, to provide a current path for a current flowing from the source of the first power transistor 71 to the ground, that is, the current flowing from the source of the first power transistor 71 to the ground flows through the first bleed transistor and the second power transistor 72, to decrease the voltage of the source of the first power transistor 71. When the voltage of the source of the first power transistor 71 is less than the source threshold, the first bleed transistor is cut off. A value of the source threshold is preferably a sum of the first voltage V1 and an ON threshold of the first bleed transistor, and the first bleed transistor is preferably a P-type MOS transistor.

Figure 9:
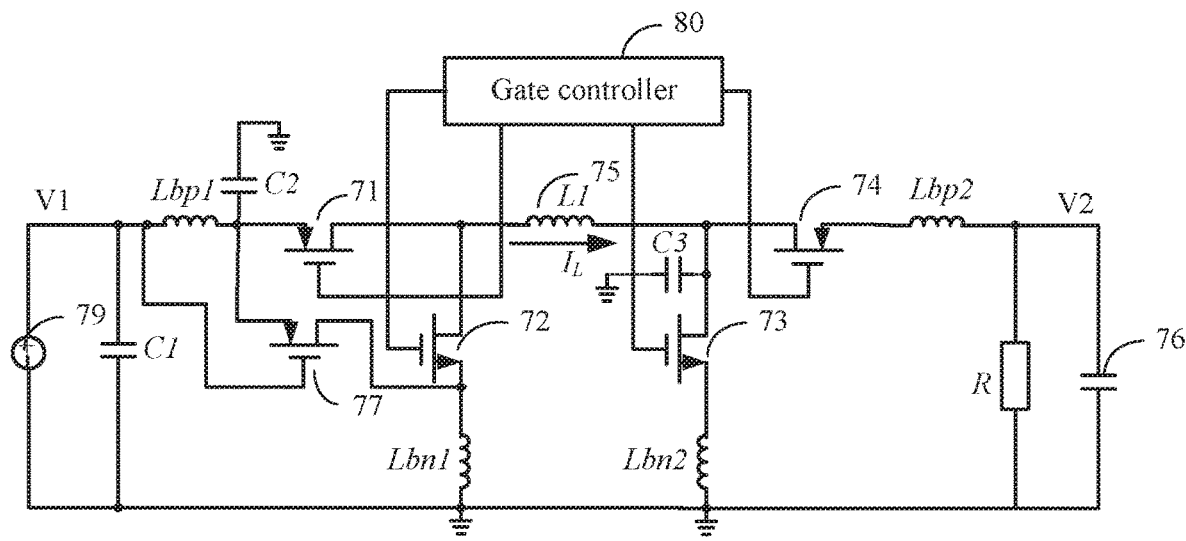
FIG. 9 is a circuit diagram of a voltage conversion circuit according to an eighth embodiment of the present disclosure.

The present disclosure further provides a voltage conversion circuit of a ninth embodiment, which differs from the voltage conversion circuit disclosed in the eighth embodiment in that: as shown in FIG. 9, a gate of a first bleed transistor disclosed in this embodiment is connected to a power supply 79, a source of the first bleed transistor is connected to a source of a first power transistor 71, a drain of the first bleed transistor is connected to a drain of a second power transistor 72, and when the first bleed transistor is conductive, a current flowing from the source of the first power transistor 71 to the ground flows through the first bleed transistor.

Figure 10:
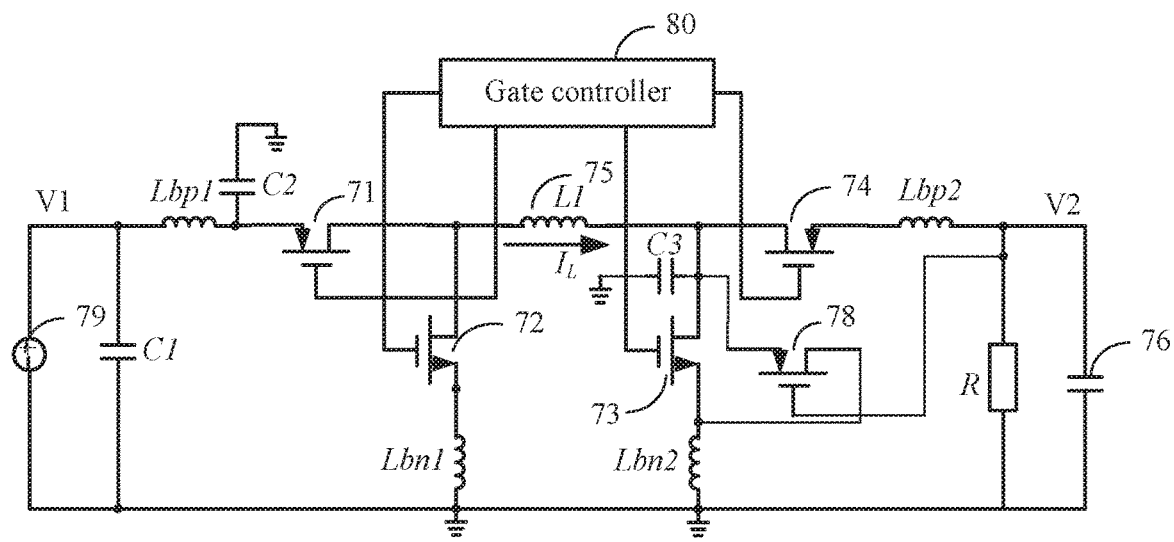
FIG. 10 is a circuit diagram of a voltage conversion circuit according to a ninth embodiment of the present disclosure.

The present disclosure further provides a voltage conversion circuit of a tenth embodiment, which differs from the voltage conversion circuit disclosed in the ninth embodiment in that: as shown in FIG. 10, when a gate controller 80 controls a second power transistor 72 to be cut off and a first power transistor 71 to be conductive, the gate controller 80 further controls a third power transistor 73 to be conductive and a fourth power transistor 74 to be cut off. A power supply 79 provides a first voltage V1 for a first energy storage element 75, that is, the power supply 79 charges the first energy storage element 75, and a current that is provided by the power supply 79 to charge the first energy storage element 75 flows through the first power transistor 71, the first energy storage element 75, and the third power transistor 73. When the gate controller 80 controls the third power transistor 73 to be cut off and the fourth power transistor 74 to be conductive, the power supply 79 providing the first voltage V1 and the first energy storage element 75 charge a second energy storage element 76, and a charge current flows through the first power transistor 71, the first energy storage element 75, the fourth power transistor 74, and the second energy storage element 76. A second bleed module 78 includes a second bleed transistor. A gate of the second bleed transistor is connected between the fourth power transistor 74 and the second energy storage element 76, a source of the second bleed transistor is connected to a drain of the third power transistor 73, a drain of the second bleed transistor is connected to a source of the third power transistor 73. A second voltage V2 depends on the first voltage V1, an ON time of the third power transistor 73 and an ON time of the fourth power transistor 74.

When the third power transistor 73 is cut off, because a current flowing through a third parasitic inductor Lbn2 cannot change abruptly, the current flowing through the third parasitic inductor Lbn2 continues charging a parasitic capacitor C3, causing a voltage of the drain of the third power transistor 73 to be charged to a high level. When the voltage of the drain of the third power transistor 73 reaches a source threshold, the second bleed transistor is conductive, to provide a current path for a current flowing from the drain of the third power transistor 73 to the ground, that is, the current flowing from the drain of the third power transistor 73 to the ground flows through the second bleed transistor, to decrease the voltage of the drain of the third power transistor 73. When the voltage of the drain of the third power transistor 73 is less than the source threshold, the second bleed transistor is cut off. A value of the source threshold is preferably a sum of the first voltage V1 and an ON threshold of the second bleed transistor, and the second bleed transistor is preferably a P-type MOS transistor.

In conclusion, in the present disclosure, a bleed module is connected in parallel to a first power transistor or a third power transistor, so that a voltage difference between a drain and a source of the first power transistor or between a drain and a source of the third power transistor can be decreased and a risk of burning out the first power transistor or the third power transistor is reduced, thereby avoiding an increase in manufacturing costs.

The foregoing descriptions are merely embodiments of the present disclosure, and the protection scope of the present disclosure is not limited thereto. All equivalent structure or process changes made according to the content of this specification and accompanying drawings in the present disclosure or by directly or indirectly applying the present disclosure in other related technical fields shall fall within the protection scope of the present disclosure.

What is claimed is:

1. A voltage conversion circuit for converting a first voltage provided by a power supply into a second voltage, the voltage conversion circuit comprising:
   a p-type metal oxide semiconductor (PMOS) transistor;
   an N-type MOS (NMOS) transistor configured to be cut off when the PMOS transistor is conductive and be conductive when the PMOS transistor is cut off, wherein the source of the PMOS transistor is coupled to the power supply, and a drain of the PMOS transistor is coupled to a drain of the NMOS transistor, and a source of the NMOS transistor is grounded;
   a bleed circuit comprising a bleed transistor configured to conduct and provide a current path for a current flowing from the source of the PMOS transistor or the power supply to ground when the PMOS transistor is cut off and a voltage of the source of the PMOS transistor reaches a source threshold of the bleed transistor, wherein a gate of the bleed transistor is coupled to the power supply, a source of the bleed transistor is coupled to the source of the PMOS transistor, and a drain of the bleed transistor is coupled between the drain of the PMOS transistor and the drain of the NMOS transistor; and
   when the bleed transistor is conductive, current flowing from the source of the PMOS transistor or the power supply to ground flows through the current path including the bleed transistor and the NMOS transistor.

2. A voltage conversion circuit for converting a first voltage provided by a power supply into a second voltage, the voltage conversion circuit comprising:
   a p-type metal oxide semiconductor (PMOS) transistor;
   an N-type MOS (NMOS) transistor configured to be cut off when the PMOS transistor is conductive and be conductive when the PMOS transistor is cut off, wherein a source of the PMOS transistor is coupled to the power supply, and a drain of the PMOS transistor is coupled to a drain of the NMOS transistor, and a source of the NMOS transistor is grounded;
   a bleed circuit comprising a bleed transistor configured to conduct and provide a current path for a current flowing from the source of the PMOS transistor or the power supply to ground when the PMOS transistor is cut off and a voltage of the source of the PMOS transistor reaches a source threshold of the bleed transistor, wherein a gate of the bleed transistor is coupled to the power supply, a source of the bleed transistor is coupled to the source of the PMOS transistor, and a drain of the bleed transistor is grounded; and
   when the bleed transistor is conductive, current flowing from the source of the PMOS transistor to ground flows through the current path including the bleed transistor.

3. A voltage conversion circuit for converting a first voltage provided by a power supply into a second voltage, the voltage conversion circuit comprising:
   a p-type metal oxide semiconductor (PMOS) transistor;
   an N-type MOS (NMOS) transistor configured to be cut off when the PMOS transistor is conductive and be conductive when the PMOS transistor is cut off; and
   a bleed circuit comprising a first terminal coupled to a source of the PMOS transistor and a second terminal coupled to a drain of the PMOS transistor or a source of the NMOS transistor, wherein the bleed circuit comprises a bleed transistor configured to conduct and provide a current path for a current flowing from a drain of the NMOS transistor to ground when the NMOS transistor is cut off and the voltage of a drain of the NMOS transistor reaches a source threshold of the bleed transistor.

4. The circuit according to claim 3, wherein a value of the source threshold is a sum of the first voltage provided by the power supply and an ON threshold of the bleed transistor.

5. The circuit according to claim 3, wherein:
   the drain of the NMOS transistor is coupled to the power supply and the drain of the PMOS transistor and the source of the NMOS transistor is grounded, and the source of the PMOS transistor is coupled to an energy storage element;
   a source of the bleed transistor is coupled to the drain of the NMOS transistor;
   a drain of the bleed transistor is coupled to the source of the NMOS transistor; and
   when the bleed transistor is conductive, current flowing from the drain of the NMOS transistor to ground flows through the current path including the bleed transistor.

6. A voltage conversion circuit for converting a first voltage provided by a power supply into a second voltage, the voltage conversion circuit comprising:
   a p-type metal oxide semiconductor (PMOS) transistor;
   an N-type MOS (NMOS) transistor, configured to be cut off when the PMOS transistor is conductive and be conductive when the PMOS transistor is cut off; and
   a bleed circuit comprises a first terminal coupled to a drain of the NMOS transistor and a second terminal coupled to a source of the NMOs transistor.

7. The circuit according to claim 6, wherein the bleed circuit comprises a bleed transistor configured to conduct and provide a current path for a current flowing from a source of the PMOS transistor or the power supply to ground when the PMOS transistor is cut off and a voltage of the source of the PMOS transistor reaches a source threshold of the bleed transistor.

8. The circuit according to claim 7, wherein a value of the source threshold is a sum of the first voltage and an ON threshold of the bleed transistor.

9. The circuit according to claim 6, further comprising:
   a gate controller coupled to a gate of the PMOS transistor and a gate of the NMOS transistor, wherein the gate controller is configured to control the PMOS transistor and the NMOS transistor to be conductive or to be cut off separately.

10. The circuit according to claim 6, wherein the bleed circuit comprises a bleed transistor configured to conduct and provide a current path for a current flowing from a drain of the NMOS transistor to ground when the NMOS transistor is cut off and the voltage of the drain of the NMOS transistor reaches a source threshold of the bleed transistor.

11. A voltage conversion circuit for converting a first voltage provided by a power supply into a second voltage, the voltage conversion circuit comprising:
   a p-type metal oxide semiconductor (PMOS) transistor;
   an N-type MOS (NMOS) transistor configured to be cut off when the PMOS transistor is conductive and be conductive when the PMOS transistor is cut off; and
   a bleed circuit configured to provide an optional current path for bleeding for the PMOS transistor to decrease a voltage difference between a source and a drain of the PMOS transistor or for the NMOS transistor to decrease a voltage difference between a drain and a source of the NMOS transistor.

12. The circuit according to claim 11, wherein the bleed circuit comprises a bleed transistor configured to conduct and provide a current path for a current flowing from a source of the PMOS transistor or the power supply to ground when the PMOS transistor is cut off and a voltage of the source of the PMOS transistor reaches a source threshold of the bleed transistor.

13. The circuit according to claim 12, wherein a value of the source threshold is a sum of the first voltage and an ON threshold of the bleed transistor.

14. The circuit according to claim 11, further comprising:
   a gate controller coupled to a gate of the PMOS transistor and a gate of the NMOS transistor, wherein the gate controller is configured to control the PMOS transistor and the NMOS transistor to be conductive or to be cut off separately.

15. The circuit according to claim 11, wherein the bleed circuit comprises a bleed transistor configured to conduct and provide a current path for a current flowing from the drain of the NMOS transistor to ground when the NMOS transistor is cut off and the voltage of the drain of the NMOS transistor reaches a source threshold of the bleed transistor.

* * * * *

UNITED STATES PATENT AND TRADEMARK OFFICE
CERTIFICATE OF CORRECTION

PATENT NO. : 10,680,519 B2  
APPLICATION NO. : 16/183233  
DATED : June 9, 2020  
INVENTOR(S) : Wang et al.

Page 1 of 1

It is certified that error appears in the above-identified patent and that said Letters Patent is hereby corrected as shown below:

In the Claims

Claim 1: Column 15, Line 29: "wherein the source of the PMOS transistor is coupled" should read -- wherein a source of the PMOS transistor is coupled --.
Claim 6: Column 16, Line 48: "to a source of the NMOs transistor." should read -- to a source of the NMOS transistor. --.

Signed and Sealed this  
First Day of June, 2021

Drew Hirshfeld  
*Performing the Functions and Duties of the  
Under Secretary of Commerce for Intellectual Property and  
Director of the United States Patent and Trademark Office*